(12) United States Patent
Den et al.

(10) Patent No.: US 7,348,670 B2
(45) Date of Patent: Mar. 25, 2008

(54) NANOSTRUCTURE, ELECTRONIC DEVICE AND METHOD OF MANUFACTURING THE SAME

(75) Inventors: Tohru Den, Tokyo (JP); Kazuhiko Fukutani, Santa Cruz, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 360 days.

(21) Appl. No.: 10/533,565

(22) PCT Filed: Dec. 12, 2003

(86) PCT No.: PCT/JP03/15948

§ 371 (c)(1),
(2), (4) Date: May 3, 2005

(87) PCT Pub. No.: WO2004/054922

PCT Pub. Date: Jul. 1, 2004

(65) Prior Publication Data

US 2006/0112466 A1    May 25, 2006

(30) Foreign Application Priority Data

Dec. 13, 2002   (JP)   ............... 2002-363128

(51) Int. Cl.
*H01L 23/48* (2006.01)
(52) U.S. Cl. .............. 257/746; 977/762; 977/893
(58) Field of Classification Search ............ 257/5, 257/746; 438/688, 800; 977/700, 762, 893
See application file for complete search history.

(56) References Cited

U.S. PATENT DOCUMENTS 5,997,958 A    12/1999  Sato et al. ............... 427/468
6,231,744 B1    5/2001  Ying et al. ............... 205/324
6,278,231 B1    8/2001  Iwasaki et al. ........... 313/310
6,359,288 B1    3/2002  Ying et al. ............... 257/14
6,401,526 B1    6/2002  Dai et al. ................. 73/105
6,709,929 B2 *  3/2004  Zhang et al. ............. 438/268
2001/0028872 A1  10/2001 Iwasaki et al. .......... 423/447.3

(Continued)

FOREIGN PATENT DOCUMENTS

EP          0 951 047 A2    10/1999

(Continued)

OTHER PUBLICATIONS

Maggie Paulose et al., "Self-Assembled Fabrication of Aluminum-Silicon Nanowire Networks," 81(1) Appl. Phys. Lett. 153-55 (Jul. 2002).

(Continued)

*Primary Examiner*—W. David Coleman
(74) *Attorney, Agent, or Firm*—Fitzpatrick, Cella, Harper & Scinto

(57) ABSTRACT

Cylinders having Al as a major constituent are orderly arrayed in an (Si, Ge) matrix. In a nanostructure in the form of a mixture film having a plurality of cylinders having Al as a major constituent, and a matrix region surrounding the plurality of cylinders and having Si and/or Ge as a major constituent, the total amount of Si and Ge is in the range from 20 to 70 atomic % in the mixture film, the cylinders are orderly arrayed, the diameter of the cylinders is in the range from 1 to 30 nm, and the interval between the cylinders is 30 nm or less.

24 Claims, 7 Drawing Sheets

U.S. PATENT DOCUMENTS

| | | | |
|---|---|---|---|
| 2002/0114949 A1 | 8/2002 | Bower et al. | 428/401 |
| 2002/0117659 A1 | 8/2002 | Lieber et al. | 257/14 |
| 2002/0130311 A1 | 9/2002 | Lieber et al. | 257/1 |
| 2002/0172820 A1 | 11/2002 | Majumdar et al. | 428/357 |
| 2002/0175408 A1 | 11/2002 | Majumdar et al. | 257/734 |
| 2002/0178846 A1 | 12/2002 | Dai et al. | 73/886.5 |
| 2003/0089899 A1 | 5/2003 | Lieber et al. | 257/9 |
| 2003/0132461 A1 | 7/2003 | Roesner et al. | 257/213 |
| 2004/0033339 A1 | 2/2004 | Fukutani et al. | 428/137 |
| 2004/0043208 A1 | 3/2004 | Fukutani et al. | 428/304.4 |
| 2006/0032526 A1 | 2/2006 | Fukutani et al. | 136/205 |

FOREIGN PATENT DOCUMENTS

| | | |
|---|---|---|
| JP | 10-321834 | 12/1998 |
| WO | WO 02/11216 A1 | 2/2002 |
| WO | WO 2004/054924 A1 | 7/2004 |

OTHER PUBLICATIONS

John C. Hulteen et al., "A General Template-Based Method for the Preparation of Nanomaterials," 7(7) J. Mater. Chem. 1075-87 (1997).

* cited by examiner

NANOSTRUCTURE, ELECTRONIC DEVICE AND METHOD OF MANUFACTURING THE SAME

TECHNICAL FIELD

The present invention relates a nanostructure formed of a mixture including Al, Si and/or Ge, an electronic device and a method of manufacturing the same. In this specification, (Si, Ge) denotes Si, Ge or a mixture including Si and Ge. More particularly, the present invention relates to a structure in which Al cylinders forming a honeycomb array are orderly formed in a (Si, Ge) matrix region.

BACKGROUND ART

In recent years, there has been a growing interest in nanosized microstructures applicable for use in functional materials and functional devices.

As a method of fabricating such a microstructure, a method may be mentioned in which a microstructure is directly fabricated by a semiconductor processing technique typified by a fine pattern forming technique, such as photolithography.

Apart from the above-described semiconductor processing technique, there is a technique using the phenomenon of self-organization or self-formation of a material. That is, a novel microstructure is thereby realized on an orderly structure spontaneously formed.

It is possible that a nanometer, as well as a micrometer, scale structure can be easily formed by a technique using the self-organization or self-formation phenomenon. A number of studies have therefore been made regarding this kind of technique. For example, Japanese Patent Application Laid-Open No. H10-321834 discloses a method of forming a metallic fine grain aggregate in the form of a wire by using a phenomenon in which metallic fine grains separate in a self-organization manner by their mutual electric or magnetic action.

As a method of forming fine orderly holes, anodized alumina film may be mentioned. An anodized alumina film is a porous film having fine holes grown in the film surface perpendicularly from the film surface (R. C. Furneaux, W. R. Rigby & A. P. Davidson NATURE vol. 337 P 147 (1989)). This porous oxide film is characterized by having a unique geometrical structure in which extremely fine holes having a diameter of several nanometers to several hundred nanometers are arrayed at intervals of several nanometers to several hundred nanometers generally in parallel with reach other.

These fine holes have a high aspect ratio and have improved uniformity in the diameter in their cross-sections. The diameter and the interval of these fine holes can be controlled to some degree by adjusting the current and voltage at the time of anodization.

Also, a technique of forming fine holes in an Si substrate surface by anodization of Si is generally known. Ordinarily, in this anodization, a positive voltage is applied to the substrate in a fluoric acid solution to etch and remove Si, thereby forming fine holes.

While various studies have been made on fine structures as described above, there has been a demand for a novel microstructure smaller in size and a controlled method of manufacturing such a microstructure.

For instance, the interval between fine holes in anodized alumina film is ordinarily larger than 10 nm, while the fine hole diameter is slightly smaller than 10 nm. It is extremely difficult to fabricate an orderly structure having such a size.

Also, fine holes can easily branch off in anodization of Si and only a limited number of substrates can be used. It is also difficult to obtain orderly fine, nanosized holes. Also, it is difficult to fill these fine holes with a material, such as a metal.

DISCLOSURE OF THE INVENTION

Therefore, an object of the present invention is to provide a nanostructure and a method of manufacturing the nanostructure, more particularly a method of manufacturing a nanostructure as an ordered structure of a size smaller than 10 nm.

According to an aspect of the present invention, there is provided a nanostructure in the form of a mixture film, which comprises a plurality of cylinders comprising Al as a major constituent, and a matrix region surrounding the plurality of cylinders and comprising Si and/or Ge, wherein the total amount of Si and Ge is contained in a proportion in the range from 20 to 70 atomic % in the mixture film; the cylinders are orderly arrayed; the diameter of the cylinders is in the range from 1 to 30 nm; and the interval between the cylinders is 30 nm and less.

According to another aspect of the present invention, there is provided a method of manufacturing a nanostructure in the form of a mixture film having a plurality of cylinders having a diameter in the range from 1 to 30 nm and an interval of 30 nm and less and comprising Al as a major constituent, and a matrix region surrounding the plurality of cylinders and comprising Si and/or Ge, the method comprising the steps of:

forming an orderly region for growing Al with priority on a substrate, and thereafter forming the mixture film which has Al and Si and/or Ge and in which the total amount of Si and Ge is contained in a proportion in the range from 20 to 70 atomic %, to fabricate the mixture film.

According to still another aspect of the present invention, there is provided a structure comprised by a first material and a second material, characterized in that a columnar member comprised by the first material is surrounded by a region comprised by the second material, that the second material in the structure is contained in a proportion in the range from 20 to 70 atomic % of the total amount of the first material and the second material, and that the columnar member is placed on a growth starting portion provided in advance.

According to a further aspect of the present invention, there is provided a method of manufacturing a structure, characterized by having a step of preparing a substrate having a growth stating portion, and a step of forming a structure having on the substrate a columnar member comprised by a first material and a region comprised by a second material and surrounding the columnar member, the second material being contained in a proportion in the range from 20 to 70 atomic % of the total amount of the first material and the second material in the structure.

In the method of manufacturing the Al—(Si, Ge) mixture film nanostructure in accordance with the present invention, the ordered region is which Al is grown or attached with priority in comparison with (Si, Ge) is fabricated on the substrate in advance.

It is assumed that expression (Si, Ge) in the present invention denotes Si, Ge or a mixture of Si and Ge ($Si_xGe_{1-x}$ (0<x<1)).

Description will be made as to how the present invention was achieved.

The inventors of the present invention came up with findings described below in the course of pursuing the study of microstructures using Al.

That is, the inventors found a case where Al was formed in a self-formation manner under certain conditions when (Si, Ge) was added at the time of formation of an Al film on a substrate.

The inventors also found it possible to selectively grow an Al columnar structure in a place where Al could grow easily. The inventors of the present invention earnestly pursued the study on the basis of the above-described findings to achieve the present invention.

Applications of the Al—(Si, Ge) mixture in the present invention to various basic materials and various devices are conceivable. For instance, applications to various quantum electronic devices including single-electron transistors and single-electron memories. Since Al is a superconductor, applications in superconducting Josephson devices and quantum computing devices are possible if fine superconducting cylinders or small spacings between the cylinders are used.

Also, the Al—(Si, Ge) mixture in the present invention can be used as a dry etching or wet etching mask for the purpose of processing a separate substrate or a film on a substrate.

Also, a structure in accordance with the present invention is constituted by a first material and a second material and characterized in that a columnar member constituted by the first material is surrounded by a region constituted by the second material, that the second material in the structure is contained in a proportion in the range from 20 to 70 atomic % of the total amount of the first material and the second material, and that the columnar member is placed on a growth starting portion provided in advance.

A method of manufacturing a structure in accordance with the present invention is characterized by having a step of preparing a substrate having a growth starting portion, and a step of forming a structure having on the substrate a columnar member constituted by a first material and a region constituted by a second material and surrounding the columnar member, the second material being contained in a proportion in the range from 20 to 70 atomic % of the total amount of the first material and the second material in the structure. The growth starting portion is a portion on which at least the columnar member is formed, and which has a convex or projecting shape.

BEST MODE FOR CARRYING OUT THE INVENTION

An embodiment of the present invention will be described in detail with reference to the drawings.

Construction of Nanostructure

Figure 1A:
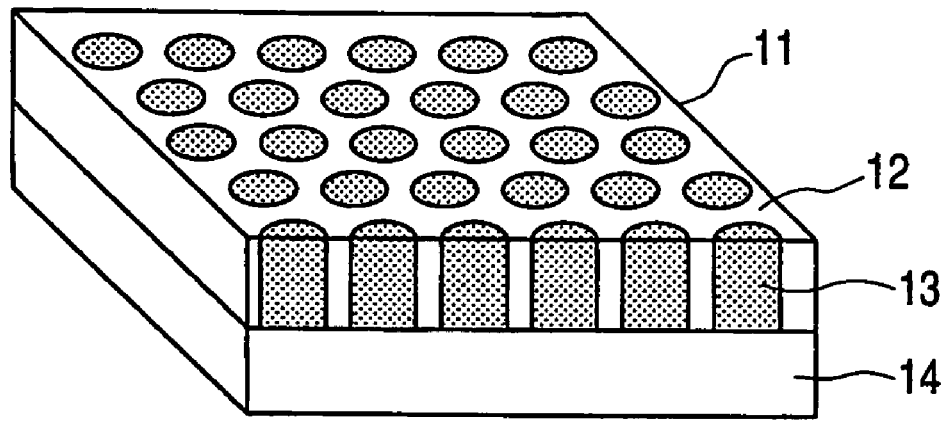
FIG. 1A is a perspective view of a nanostructure in accordance with the present invention.
Figure 1B:
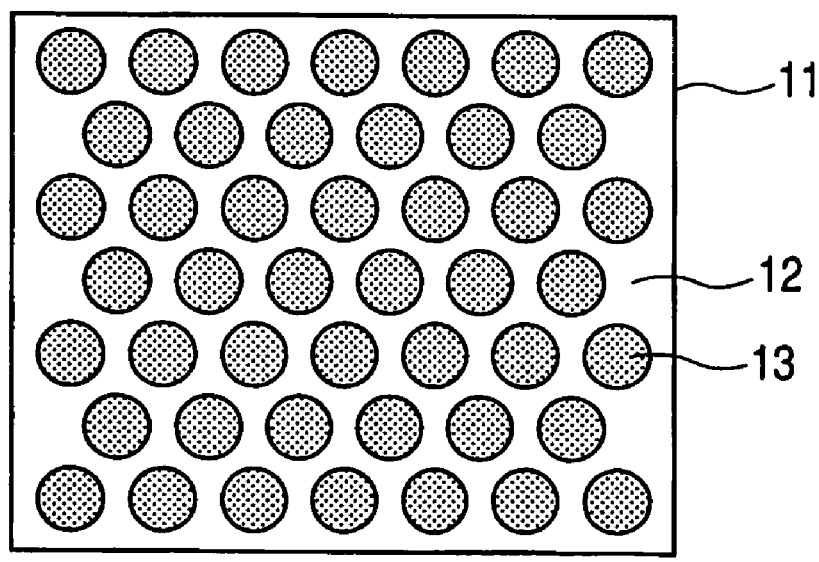
FIG. 1B is a top plan view of an example of the nanostructure in accordance with the present invention.

FIG. 1A is a perspective view of a nanostructure in accordance with the present invention. FIG. 1B is a top plan view of a film of the present invention. In FIGS. 1A and 1B, an Al—(Si, Ge) nanostructure is indicated by 11, a matrix region surrounding cylinders and having (Si, Ge) as a major constituent is indicated by 12, the cylinders having Al as a major constituent are indicated by 13, and a substrate is indicated by 14.

In the Al—(Si, Ge) nanostructure 11 in the form of film formed on the substrate 14, the proportion of the total amounts of Si and Ge in the total amount is in the range from 20 to 70 atomic %, preferably in the range from 25 to 65 atomic %, more preferably in the range from 30 to 60 atomic %. If the proportion of Si+Ge is within the above-described range, Al—(Si, Ge) mixture film having cylinders 13 distributed in matrix region 12 can be obtained.

The above-described proportion (atomic %) is the value when the amounts of Si, Ge and Al in the Al—(Si, Ge) mixture film are quantitatively analyzed, for example, by an inductively coupled plasma emission analysis method. If a value in wt % is used as a unit, the range from 20 to 70 atomic %, for example, is converted into the range from 20.65 to 70.84 wt % (the conversion is made by assuming that the atomic weight of Al is 26.982 and the atomic weight of Si is 28.086).

The proportion of the total amounts of Si and Ge in the total amount of Si, Al and Ge is the value expressed by (Si+Ge)/(Si+Ge+Al)×100 in terms of a molar ratio. That is, it is the proportion of Si+Ge in Si+Ge+Al when Si+Ge+Al is 100 atomic %.

In the composition of cylinders 13, Al is contained as a major constituent and any of other elements, such as Si, Ge, oxygen, argon, nitrogen and hydrogen, may also be contained as long as columnar microstructures can be obtained.

In the composition of the (Si, Ge) region surrounding the cylinders, Si and Ge are contained as major constituents and any of other elements, such as Al, oxygen, argon, nitrogen and hydrogen, may also be contained as long as the (Si, Ge) region surrounds the columnar microstructures having Al as a major constituent.

The matrix region 12 may be used in an amorphous form or a micro-(poly-)crystalline form. However, the matrix region 12 in the form of amorphous (Si, Ge) is preferred in terms of its insulating property, because the band gap is increased by forming amorphous (Si, Ge) relative to that in the case of crystalline (Si, Ge) to improve the electrical insulating property of the basic material by which the cylinders are spaced apart from each other.

The mixture body used here represents the matrix region and the cylinders grown in the matrix region.

The cylinders 13 containing Al are circular or elliptical as seen in a plan view from above the film. Needless to say, the cylinders 13 may have any other shape if the cylinders 13 are suitably distributed in the matrix 12.

The average diameter of the cylinders in the nanostructure in accordance with the present invention is in the range from 1 to 30 nm, preferably in the range from 1 to 15 nm, more preferably in the range from 2 to 8 nm. If the cylinders have an elliptical shape or the like, the largest diameter may be set within the above-described range. The average diameter is, for example, the mean value of lengths derived as major axes in a case where the Al portions observed in an SEM photograph of the actual film surface (in an area of about 100×100 nm) is image-processed by a computer, and where the Al portions are assumed to be elliptical.

The average diameter of the cylinders tends to become smaller if the total amount of (Si, Ge) is larger. Also, when the total amount of (Si, Ge) is fixed, the cylinders become finer if the proportion of Si is higher. Therefore, it is possible to control the diameter of the cylinders by controlling the total amount of (Si, Ge) or by controlling the proportion of Si in a case where a mixture of Si and Ge is used in the matrix region.

In a nanostructure of a nanometer size (generally in the range from the order of subnanometers to 100 nm), a unique electrical, optical or chemical characteristic may be exhibited if the size is smaller than a certain characteristic length (mean free path or the like). From this viewpoint, nanostructures are considered to be useful as a functional material. The nanostructure in accordance with the present invention can also be used variously as a nanostructure if the diameter of the cylinders constituting the mixture body is in the range from 1 to 30 nm, more particularly 15 nm or smaller.

The interval between the plurality of cylinders 13, i.e., the distance between the centers, is 30 nm or less, preferably 15 nm or less, more preferably 10 nm.

Needless to say, the interval satisfies the condition that cylinders do not contact each other. The interval between the plurality of cylinders 13 can be controlled by providing ordered regions as cylinder growing points described below.

For instance, a microstructure may be mentioned in which the diameter of the above-described Al cylinder in a columnar structure is 1 to 15 nm, the interval between the Al cylinders is 7 to 30 nm, the ratio of the height and the diameter, i.e., the aspect ratio, of the Al cylinders is 0.1 to 100000, and the Al cylinders are generally perpendicular to the substrate.

The shape of the cylinders 13 seen along a substrate cross-section may be rectangular as shown in FIG. 1A, square, or trapezoidal. The length of the cylinders may be selected in the range from 1 nm to 100 µm.

In particular, in a case where the diameter of the cylinders is, for example, 1 to 15 nm and the center distance is 10 to 20 nm, the length may be controlled in the range from 1 nm to several microns. When the length is in the range from several nanometers to several ten nanometers (when the ratio of the length and the diameter is low), the cylinders 1 act as aluminum quantum dots (zero dimension). When the length is above this range, the cylinders act as aluminum quantum wires (one dimension).

The above-described cylinders 13 containing aluminum are separated from each other by the matrix 12 having (Si, Ge) as a major constituent, as shown in FIG. 1B. That is, a plurality of columnar structures are distributed in the (Si, Ge) regions.

It is preferred that the cylinders 13 be orderly formed in a particular direction, as shown in FIG. 1A. It is particularly preferred that they are orderly formed perpendicularly to the substrate, as shown in FIG. 1A.

It is preferred that the cylinders 13 be orderly arrayed in a particular form. This is an important point in the application. That is, because of the orderly structure, the cylinders can be made uniform in size and the controllability of physical properties or the like can be improved. Also, because of the orderliness, the cylinders are uniformly spaced apart from each other, so that the electron tunnel barriers between the cylinders are uniform.

No particular substrate is exclusively used as the substrate 14. However, an insulating substrate, such as a quartz glass substrate or a plastic substrate, or a semiconductor substrate, such as a silicon substrate, a germanium substrate, a gallium arsenide substrate or an indium phosphide substrate, may be used. A flexible substrate (e.g., a polyimide resin or the like) may be used if the mixture film can be formed on the substrate serving as a supporting member. Further, a substrate formed in such a manner that one or more layers are formed on a supporting substrate may be used.

Method of Manufacturing Nanostructure

Figure 2A:
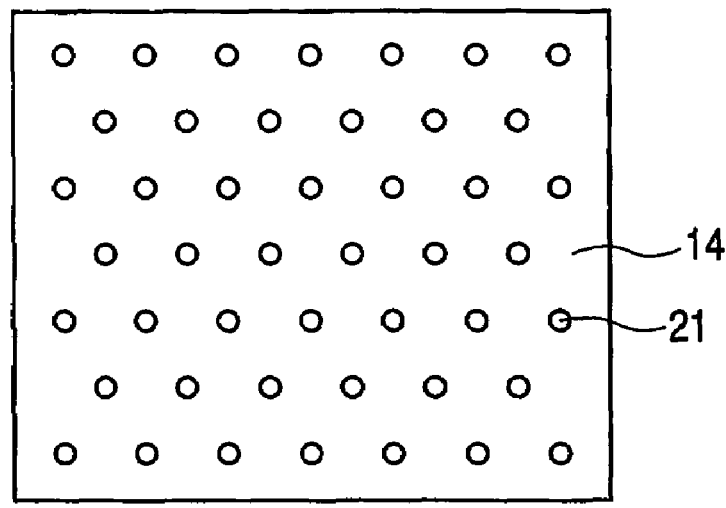
FIGS. 2A, 2B, and 2C are diagrams showing an example of the method of manufacturing the nanostructure of the present invention.
Figure 2B:
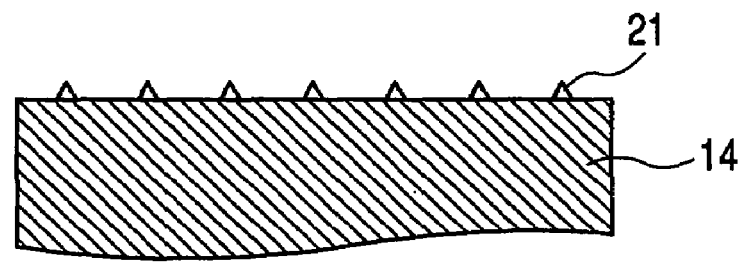
Figure 2C:
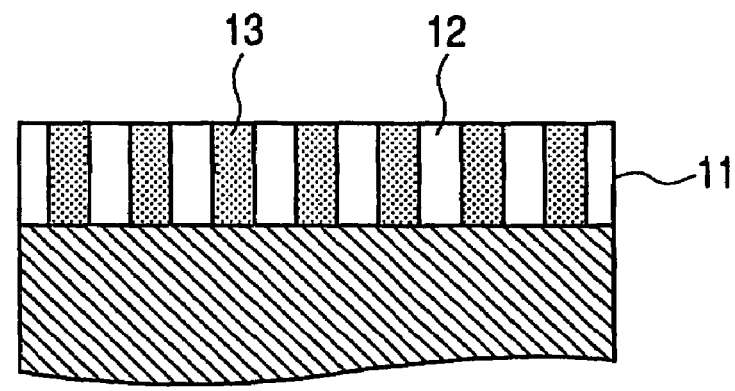

A method of manufacturing a nanostructure in accordance with the present invention will be described with reference to FIGS. 2A to 2C. An example of Al dots will be described as orderly regions for growing Al with priority, i.e., cylinder growing points. In FIGS. 2A and 2B, the substrate is indicated by 14 and cylinder growing points are indicated by 21.

A difference in shape, a different material or the like can be used for the cylinder growing points 21 if the cylinder growing points 21 are orderly regions for growing Al with priority. According to the most effective method, dots having Al as major constituents are formed in advance on portions where the Al cylinders are to be grown.

Figure 3A:
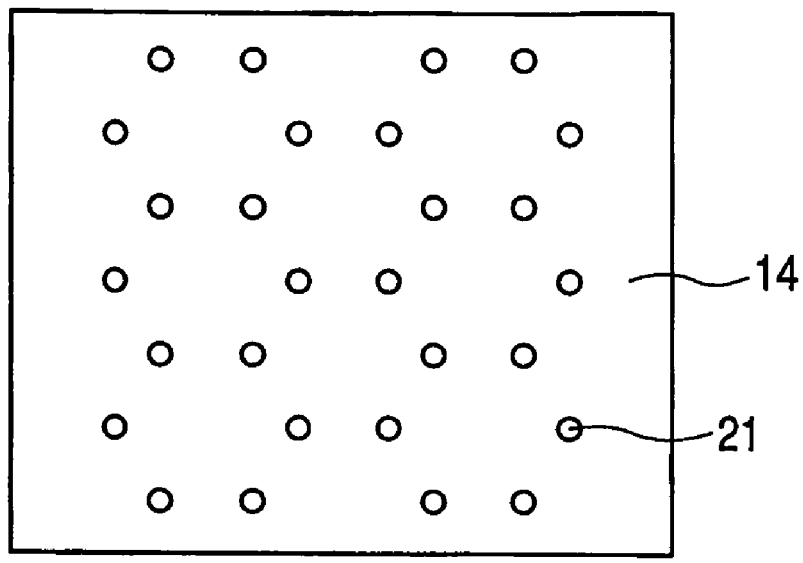
FIGS. 3A and 3B are diagrams showing an example of the nanostructure of the present invention.
Figure 3B:
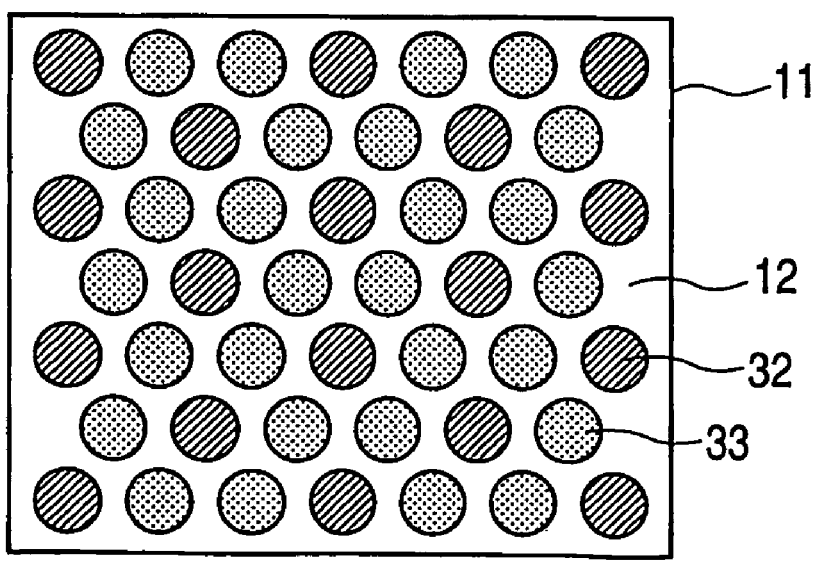

It is most effective to array the cylinder growing points 21 so that the cylinder growing points 21 correspond precisely to the desired cylinder array. If it is difficult to form such growing points, growing points corresponding only to a part of the desired cylinder array may be formed. Growing points thus formed can be recognized as effective. For example, in a case where there is a need to obtain a honeycomb cylinder array, a graphite array shown in FIG. 3A and having such a configuration that some portions of the honeycomb array are lost can be used. As shown in FIG. 3B, cylinders 33 are formed from starting points corresponding to the cylinder growing points 21 as described above, and cylinders 32 are also grown in places where no cylinder growing points 21 are formed. This is due to the self-organization of the material. In this case, however, there is a possibility of a difference, e.g., a slight difference in diameter being recognized between the cylinders at the growing points and the cylinders growing in a self-organization manner. It is not necessary that the array of cylinder growing points 21 be a honeycomb array. A square array or a rectangular array may be used as the array of cylinder growing points 21. In such a case, however, it is difficult to obtain cylinders having a high aspect ratio.

Figure 4A:
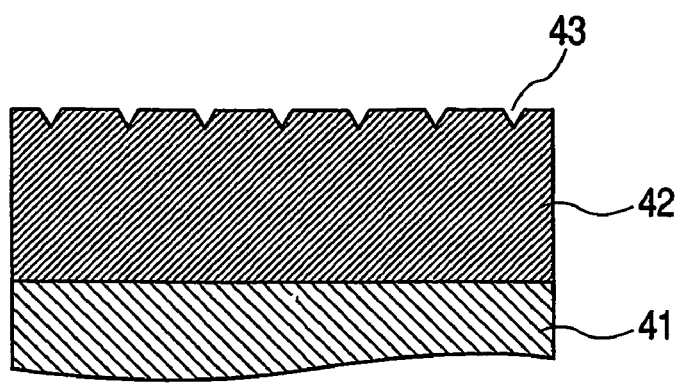
FIGS. 4A, 4B, 4C, and 4D are diagrams showing the process of fabricating the nanostructure of the present invention.
Figure 4B:
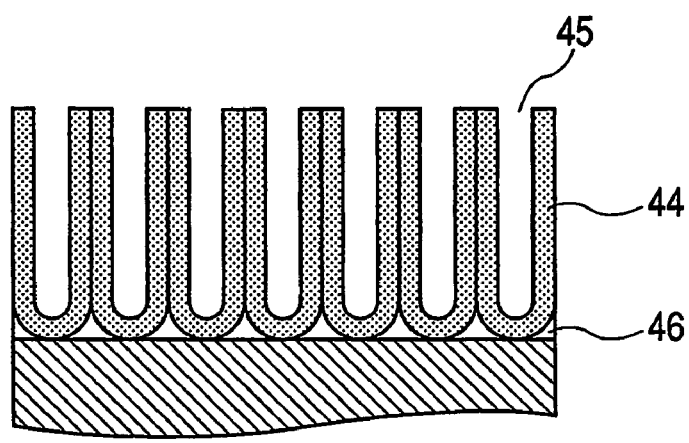
Figure 4C:
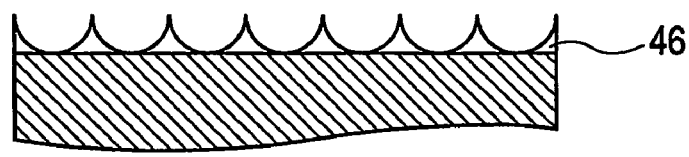
Figure 4D:
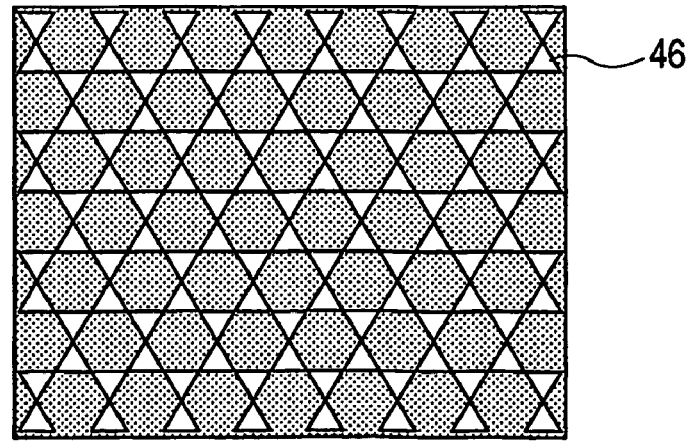

As a method of fabricating such growth starting points, a method may be used in which portions of the Al surface are oxidized by an SPM method and points not oxidized are formed as cylinder growing points 21. However, a method using nanoimprinting or anodization may be mentioned as a more efficient method. For example, as shown in FIG. 4A, Al film 42 is anodized on the substrate and anodization is stopped at a suitable point in time. After anodization, portions 46 where Al has not been oxidized remain in a graphite array on the substrate surface (FIG. 4B). The oxidized anodized film is removed by etching (FIG. 4C) to form Al dots 46 in the graphite array on the substrate (FIG. 4D). Cylinders are fabricated on these dots formed as cylinder growing points 21. The cylinders are thereby formed in a honeycomb array. Self-organization also contributes to this formation. It is to be noted here that the density of the cylinders is thrice the density of the original fine holes in the Al anodized film.

A magnetron sputtering method, which is a film forming method for forming a substance in a nonequilibrium state, will be described as a method for forming an Al—(Si, Ge) mixture film in this embodiment.

A target as a row material is obtained by placing a Ge chip or an Si chip 72 on an Al target substrate 71. A plurality of Si chips or Ge chips may be placed separately from each other. However, this placement method is not exclusively used. An Al—(Si, Ge) sintered material prepared by sintering a predetermined amount a powder of Al and (Si, Ge) may be used as a target material. If such a target is used, a uniform film having a reduced variation in film composition can be formed.

A method of separately preparing an Al target, an Si target and a Ge target and performing sputtering simultaneously from these targets may alternatively be used.

The total amounts of (Si, Ge) in the film formed is in the range from 20 to 70 atomic % of the total amount of Al and (Si, Ge), preferably, in the range from 25 to 65 atomic %, more preferably 30 to 60 atomic %.

The substrate temperature is 300° C. or lower, preferably 200° C. or lower. More preferably, the substrate temperature is room temperature or a temperature lower than room temperature. If the total amount of (Si, Ge) is fabricated in such a temperature range, a nanostructure having cylinders distributed in the (Si, Ge) region can be obtained. In the Al—(Si, Ge) mixture film formed by the film forming method in a nonequilibrium state at a substrate temperature of 300° C. or lower, Al and (Si, Ge) form a structure similar to a eutectic structure, and Al forms nanocylinders on the order of several nanometers and separates from the (Si, Ge) region in a self-organized manner. The reason for mentioning the similarity to the eutectic is that (Si, Ge) is amorphous in ordinary cases and does not necessarily exist in a crystalline form. For the present invention, the fact that the content of (Si, Ge) in the composition is larger than that in the case of formation at the eutectic point is also important. If the Al—(Si, Ge) film is formed at a specimen temperature not lower than at 200° C., the fabricated Al—(Si, Ge) mixture film starts growing into larger crystals in a more stable manner and has a reduced interfacial area in comparison with a structure formed at a temperature equal to or lower than 200° C. It does not form a nanocylinder on the order of several nanometers.

The total amount of (Si, Ge) in the Al—(Si, Ge) mixture body can be controlled, for example, by changing the amount of the material of the Si chip or Ge chip placed on the Al target or by using a target prepared by changing the mixing ratio of Al and the Al—(Si, Ge) powder.

In the case of performing the film formation in a nonequilibrium state, particularly in the case of sputtering, the pressure in the reactor when argon gas is caused to flow is preferably about 0.2 to 1 Pa. However, the pressure is not particularly limited to this value. Film forming may be performed at any pressure if the argon plasma is formed with stability.

The substrate 14 may be, for example, an insulating substrate, such as a quartz glass substrate or a plastic substrate, a semiconductor substrate, such as a silicon substrate or a germanium substrate, or any of these substrates on which one or more layers of film are formed. If there is no problem with the formation of aluminum nanocylinders, no particular restrictions are imposed on the selection of the material, thickness, mechanical strength, etc., of the substrate. The shape of the substrate is not limited to a smooth flat shape. The substrate may have a curved shape or a shape including a certain recess/projection or a step in the surface. However, the shape of the substrate is not limited to any particular shape if there is no problem with aluminum nanocylinders.

As a film-forming method for forming a substance in a nonequilibrium state, sputtering is preferred. However, any of the film forming methods, including evaporation (resistance heating evaporation, electron beam evaporation, etc.) and ion plating, in which a substance is formed in a nonequilibrium state, can be used. Sputtering, evaporation (resistance heating evaporation, electron beam evaporation, etc.), ion plating, etc., are called "PVD".

As a film forming process, a simultaneous film forming process in which Al and (Si, Ge) are simultaneously formed or a stacking film forming process in which layers of several atomic layers of each of Al and (Si, Ge) are stacked may be used.

Construction of Semiconductor Memory

Figure 6:
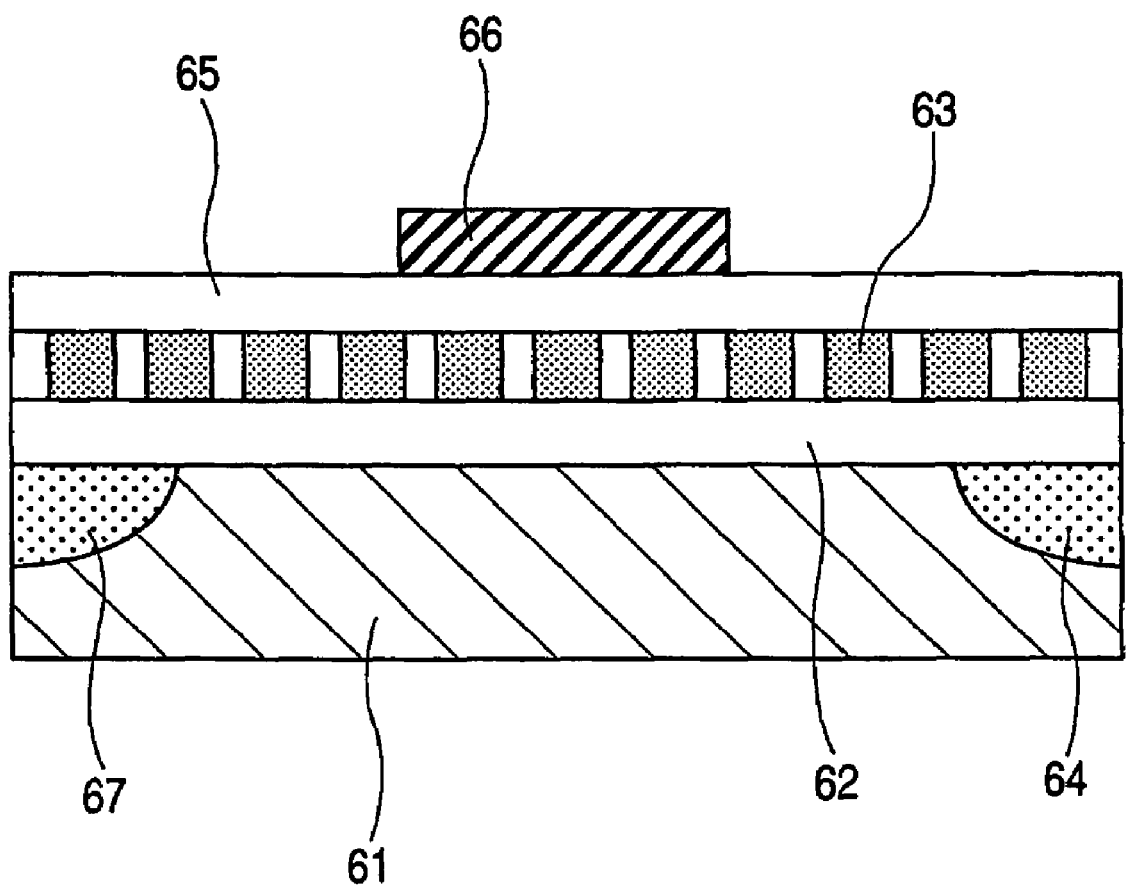
FIG. 6 is a diagram schematically showing a single-electron memory using an Al—(Si, Ge) mixture body in accordance with the present invention.
Figure 7:
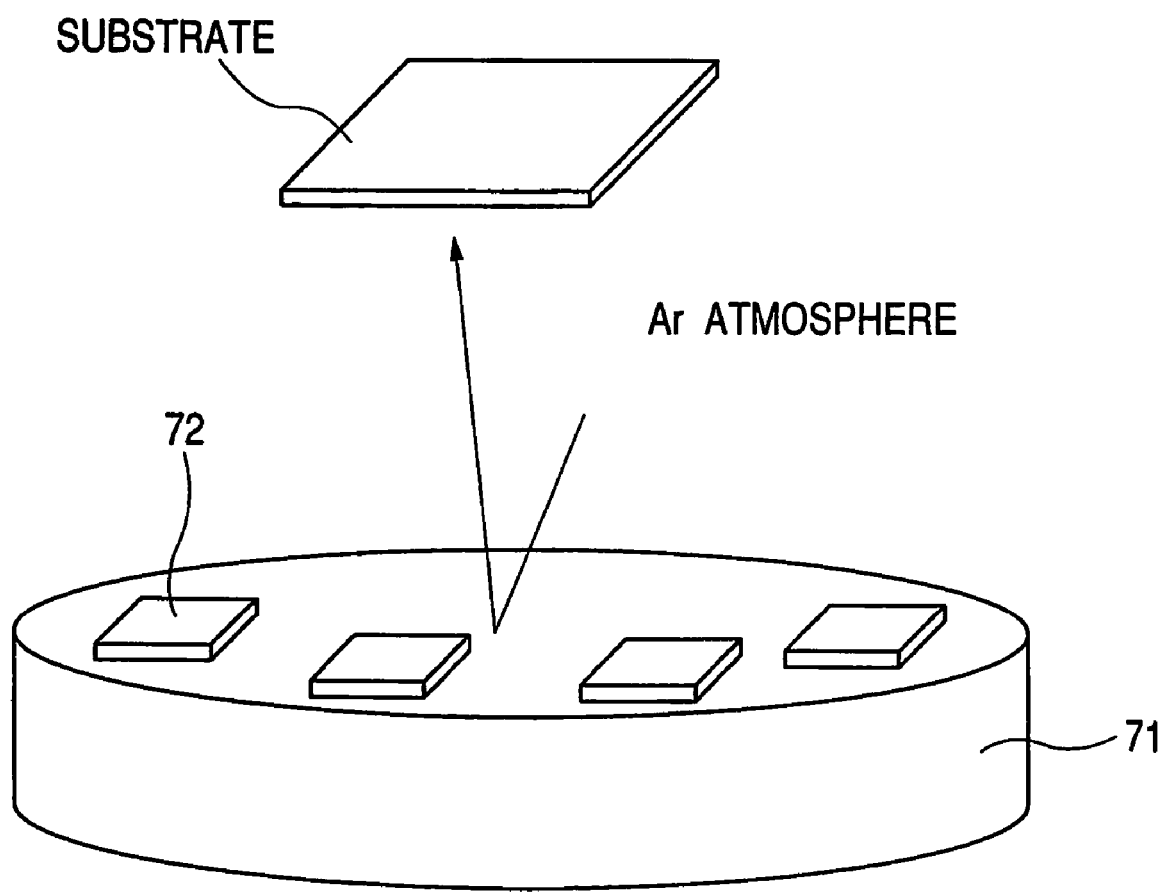
FIG. 7 is a diagram showing the method of fabricating the nanostructure of the present invention.

FIG. 6 is a diagram schematically showing a single-electron transistor using an Al—(Si, Ge) mixture body. Aluminum is formed as quantum dots (islands) as shown in FIG. 6 to enable control of electrical characteristics of a channel portion by the influence of an electric charge accumulated on the quantum dots. Because the electric charge can be accumulated on the quantum dots for a long time, a nonvolatile memory in which information does not disappear even after turning off of power can be formed. In the figure, a substrate is indicated by 61, an insulating material (e.g., silicon oxide) by 62, an Al—(Si, Ge) mixture body by 63, a drain by 64, a gate insulator by 65, a gate electrode by 66, and a source by 67.

The single-electron transistor shown herein is described, for example, in "Nanotechnology-no-subete (all about nanotechnology)" (Kogyo Chosakai Publishing Co., Ltd.) pp. 114-117.

By applying the Al—(Si, Ge) structure as described above, a single-electron memory using a quantum effect, a single-electron transistor using the same principle, or the like can be put to use.

A Josephson device or the like (not illustrated) can be fabricated by using the superconductor characteristics of Al.

This embodiment can be deemed an "electronic device having the above-described nanostructure on a semiconductor substrate with an insulating film interposed therebetween, and having a control electrode on the nanostructure with an insulating film interposed therebetween".

The present invention enables an aluminum nanocylinder to be applied in various forms, such as a quantum dot and a quantum wire, and remarkably extend the range of its application. The structure in the present invention can be used in a single state as a functional material and can also be used as a basic material or a mold for a further novel nanostructure.

EXAMPLES

Examples of the present invention will be described with reference to the drawings.

Example 1

A nanostructure of the present invention and a method of manufacturing the nanostructure will be described with reference to FIGS. 4A to 4D and FIGS. 5A to 5C.

In FIGS. 4A to 4D and FIGS. 5A to 5C, a substrate is indicated by 41, an Al film by 42, a starting point in anodization by 43, an anodized film by 44, a pore by 45, a residual Al portion by 46, a cylinder growing point by 51, an Al—Si mixture film by 52, an Si matrix region by 53, a cylinder the forming of which starts from the cylinder growing point 51 by 54, and a cylinder formed by self-organization of a material by 55.

Al Film

Al film 42 is formed at a 30 nm thickness on Si substrate 41 by using RF magnetron sputtering. Small recesses in a honeycomb array are then formed at intervals of about 15 nm in the surface of Al film 42 by using an FIB (focused ion beam) method, as shown in FIG. 4A. The recesses function as starting points 43 for fine holes in anodization.

Anodization

Al film 42 is anodized from the surface. Anodization is performed by using a 5 mol/l sulfuric acid solution and an anodization voltage of 6 V. Anodization is stopped when the anodization current slightly decreases. By anodization, the Al film is oxidized to the substrate surface as shown in FIG. 4B. While oxidation proceeds to the substrate surface at the bottom of each fine hole, residual Al portions 46 that are not anodized are formed in bottoms of portions among the fine holes.

Etching

After anodization, etching of the oxide layer is performed by immersing the specimen in a chromic acid-phosphoric acid mixture solution. The anodized alumina film is molten by this etching to expose the residual Al portions 46 on the substrate, as shown in FIG. 4C. The residual Al portions 46 are raised at the tripled points among the fine holes. Also, the residual Al portions 46 are in a graphite array, as shown in FIG. 4D. As a result of this process step, the interval between the apexes of the residual Al portions 46 is shorter by about 60% than the interval between the fine holes in the alumina film.

AlSi Film Forming

Figure 5A:
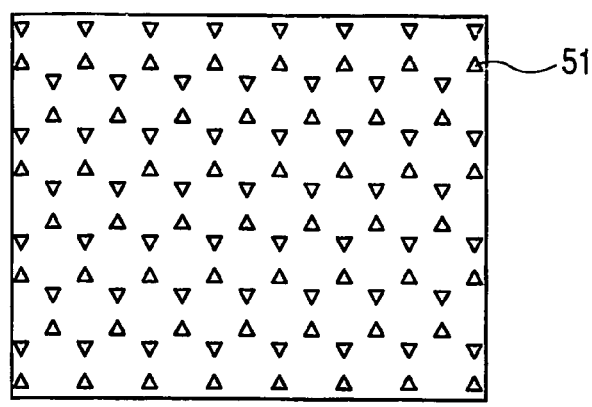
FIGS. 5A, 5B, and 5C are diagrams showing the process of fabricating the nanostructure of the present invention.

Inverse sputtering is performed in a sputtering apparatus to remove the Al oxide formed on the surface of the residual Al portions 46 before AlSi film forming. The residual Al portions 46 are thereby reduced to form cylinder growing points 51 in such a state that Al is exposed on the surface, as shown in FIG. 5A.

AlSi mixture film 52 is then formed from an Al—Si mixture target. In the composition of the Al—Si mixture target used, the mixing ratio is Al 60:Si 40. The obtained film has substantially the same composition. AlSi mixture film is formed to about 200 nm. As sputtering conditions, an Ar flow rate of 50 sccm, a discharge pressure of 0.7 Pa, and input power of 300 W were set by using an RF power supply. The substrate temperature was set to room temperature.

Figure 5B:
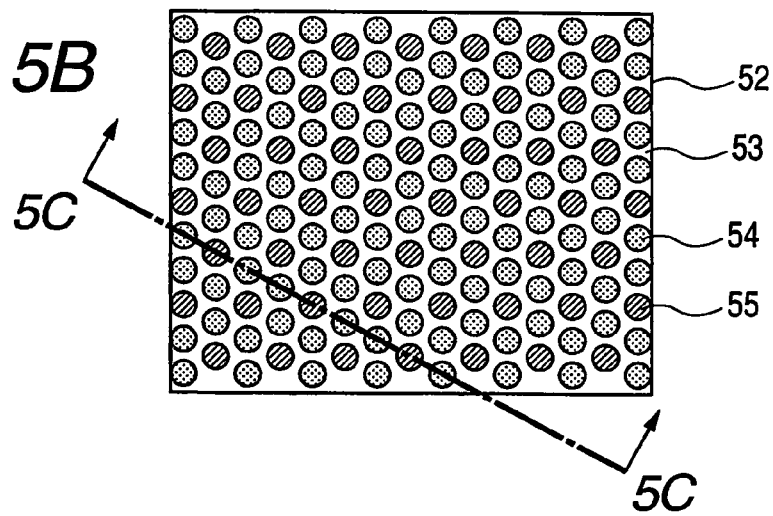
Figure 5C:
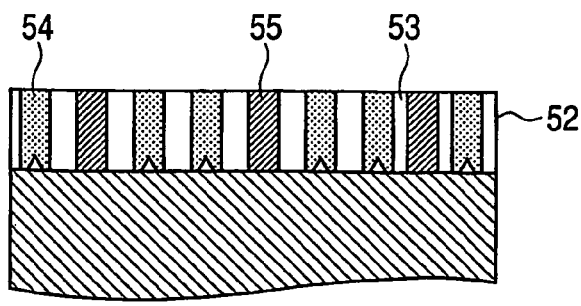

As a result, Si matrix 53 having amorphous Si as a major constituent is grown in the AlSi mixture film 52, and cylinders 54 and 55, grown perpendicularly to the substrate and having Al as a major constituent, are formed in Si matrix 53, as shown in FIGS. 5B and 5C. The cylinders 54 are grown from the cylinder growing points 51, while the cylinders 55 are not grown from the cylinder growing points 51 but grown in a self-organization manner. FIG. 5C is a cross-sectional view taken along line 5C-5C of FIG. 5B.

The average diameter of the cylinders was about 5 nm, and the average interval between the cylinders was about 8 nm.

A target formed by placing an Si chip on an Al target may be used in place of the mixture target if the desired composition ratio is set.

RF sputtering was used as sputtering in this example, but it is not exclusively used. ECR sputtering, DC sputtering and ion beam sputtering may be used. The sputtering conditions depend on the apparatus and are not limited to those described above.

Comparative Examples

With respect to a comparative specimen A, only AlSi film forming conditions were changed. A mixture target having a mixing ratio of Al 85:Si 15 in its composition was used. As sputtering conditions, an Ar flow rate of 50 sccm, a discharge pressure of 0.7 Pa, and input power of 300 W were set by using the RF power supply. The substrate temperature was set to room temperature. The specimen A was observed through an FE-SEM (field-emission scanning electron microscope). In the configuration of the surface as seen from above the substrate, which is a direction perpendicular to the substrate, the Al portions were not circular and were connected continuously to one another. That is, the structure was different from the microstructure in which Al cylinders are distributed in the Si region. The size (length) of the Al portions largely exceeded 20 nm. By observing a cross-section through the FE-SEM, it was found that the Al portions did not have such a width as to be columnar but formed a large mass exceeding several ten nanometers.

For a specimen on a glass substrate as comparative specimen B, a mixture target having a mixing ratio of Al 23:Si 75 in its composition was used. A mixture film of about 200 nm having almost the same composition ratio as the target composition was formed to about 200 nm. As sputtering conditions, an Ar flow rate of 50 sccm, a discharge pressure of 0.7 Pa, and input power of 300 W were set by using the RF power supply. The substrate temperature was set to room temperature. The specimen B was observed through the FE-SEM. In the specimen surface as seen from above the substrate, which is a direction perpendicular to the substrate, no Al portions were recognized. Even by observation of a cross-section through the FE-SEM, the clear Al portions were not observed.

Specimens in accordance with the above-described comparative examples were made by using a Si—Ge mixture composition or only Ge, and the results were the same. It is possible to form Al nanocylinders in (Si, Ge) by adjusting the content of Si and Ge to a value within at least the range from 20 to 70 atomic % of the total amount of Al, Si and Ge. It is also possible to fabricate an Al wire having an improved linearity by performing this adjustment.

As a specimen C, a mixture film of about 200 nm was formed on an Si substrate by using a target having a mixing ratio of Al 60:Si 40 in its composition. The substrate temperature was set to 220° C. The comparative specimen C was observed through the FE-SEM. In the specimen surface as seen from above the substrate, which is a direction perpendicular to the substrate, no circular or elliptical aluminum portions were recognized. That is, no Al nanocylinders were recognized. That is, it is thought that when the substrate temperature is excessively high, the material changes into a more stable state and therefore any film growth for forming Al nanocylinders as shown in FIGS. 1A and 1B or FIG. 3A or 3B is not effected.

Example 2

Nanostructures were fabricated in the same manner as in Example 1, except these nanostructures were fabricated so as to have the Si content in the Al—Si composition ratio of every 5% from 20 to 70%.

By observing the specimens through the FE-SEM, it was found that when the Si content was 25% and lower, the diameter of Al cylinders was about 10 nm and the spacing between the cylinders was excessively small in some places. When the Si content was 60% and higher, Al cylinders were grown at the cylinder growing points, but were not fully grown at some of the points. Also, cylinders 55 considered to be formed by the self-organization process had many defects.

Thus, cylinders are formed to some extent when the Si content is in the range of 20 to 70%, but it is effective for forming the desired cylinders to set the Si content in the range from 30 to 60%.

Example 3

Nanostructures were fabricated in the same manner as in Example 1, except the interval between cylinder growing points was increased to about 20 nm, Ge was added to Si in the Al—Si composition ratio, and the Al content was set to 60%, and the ratio Ge/(Si+Ge) of every 20% from 0 to 100%.

By observing the specimens through the FE-SEM, it was found that the diameter of Al cylinders was increased to about 20 nm as the Ge content was increased and some of the cylinders have a diameter close to 30 nm.

The matrix was amorphous even in the case where Ge was used.

Thus, it was found that the Al cylinders were formed even when Ge was added, and that it was advantageous to increase the Ge content when there was a need to form cylinders of a relatively large size and it was advantageous to increase the Si content when there was a need to fabricate relatively small cylinders.

INDUSTRIAL APPLICABILITY

As described above, the present invention makes it possible to provide a microstructure in which cylinders on the order of nanometers having aluminum as a major constituent are orderly distributed in a (Si, Ge) matrix, and a method of manufacturing the microstructure.

This nanostructure enables a more controllable electronic device on the order of nanometers or the like to be fabricated.

The invention claimed is:

1. A nanostructure in a form of a mixture film, which comprises a plurality of cylinders comprising Al as a major constituent, and a matrix region surrounding the plurality of cylinders and comprising Si and/or Ge,
   wherein a total amount of Si and Ge in the mixture film is in a range from 20 to 70 atomic %; the cylinders are orderly arrayed; a diameter of the cylinders is in a range from 1 to 30 nm; and an interval between the cylinders is 30 nm or less.

2. The nanostructure according to claim 1, wherein the cylinders are orderly arrayed in a honeycomb array.

3. The nanostructure according to claim 1, wherein the total amount of Si and Ge in the mixture film is in the range from 25 to 65 atomic %.

4. The nanostructure according to claim 1, wherein an average diameter of the cylinders is in a range from 2 to 8 nm.

5. The nanostructure according to claim 1, wherein the interval between the cylinders is 10 nm or smaller.

6. The nanostructure according to claim 1, wherein the matrix region is comprised of amorphous Si and/or amorphous Ge.

7. The nanostructure according to claim 1, wherein the matrix region is comprised of amorphous Si and amorphous Ge.

8. The nanostructure according to claim 1, wherein the mixture film is formed on a substrate.

9. The nanostructure according to claim 3, wherein the total amount of Si and Ge in the mixture film is in the range from 30 to 60 atomic %.

10. The nanostructure according to claim 6, wherein the matrix region is the amorphous Si.

11. The nanostructure according to claim 8, comprising wiring on a part of the substrate.

12. A method of manufacturing a nanostructure in a form of a mixture film having a plurality of cylinders having a diameter in a range from 1 to 30 nm and an interval of 30 nm or less and comprising Al as a major constituent, and a matrix region surrounding the plurality of cylinders and comprising Si and/or Ge, the method comprising the steps of:
    forming an ordered region for growing Al with priority on a substrate, and thereafter
    forming the mixture film, which has Al and Si and/or Ge and in which a total amount of Si and Ge is in a range from 20 to 70 atomic %.

13. The method of manufacturing a nanostructure according to claim 12, wherein the ordered region is a region having a honeycomb array or a pattern corresponding to part of the honeycomb array.

14. The method of manufacturing a nanostructure according to claim 12, wherein the ordered region for forming Al with priority includes a projection having Al as a major constituent.

15. The method of manufacturing a nanostructure according to claim 12, wherein the method of forming the mixture film is a film forming method of forming a substance in a nonequilibrium state.

16. The method of manufacturing a nanostructure according to claim 12, wherein the total amount of Si and Ge is in the range from 25 to 65 atomic %.

17. The method of manufacturing a nanostructure according to claim 12, wherein the total amount of Si and Ge is in the range from 30 to 60 atomic %.

18. The method of manufacturing a nanostructure according to claim 12, wherein the matrix region is Si.

19. The method of manufacturing a nanostructure according to claim 13, wherein the honeycomb array or a partial region of the honeycomb array is a graphite array.

20. The method of manufacturing a nanostructure according to claim 14, wherein the projection is fabricated by anodization of a film having Al as a major constituent and etching of anodized Al film.

21. The method of manufacturing a nanostructure according to claim 15, wherein the film forming method is sputtering.

22. The method of manufacturing a nanostructure according to claim 15, wherein a temperature of the substrate during film forming is 200° C. or lower.

23. A structure comprised by a first material and a second material, characterized in that a columnar member comprised by the first material is surrounded by a region comprised by the second material, that the second material in the structure is contained in a proportion in a range from 20 to 70 atomic % of a total amount of the first material and the second material, and that the columnar member is placed on a growth starting portion provided in advance.

24. A method of manufacturing a structure, comprising:
a step of preparing a substrate having a growth stating portion; and
a step of forming on the substrate a structure comprising a columnar member comprised by a first material and a region comprised by a second material, which surrounds the columnar member, the second material being contained in a proportion in a range from 20 to 70 atomic % of a total amount of the first material and the second material in the structure.

* * * * *

UNITED STATES PATENT AND TRADEMARK OFFICE
CERTIFICATE OF CORRECTION

| | | |
|---|---|---|
| PATENT NO. | : 7,348,670 B2 | |
| APPLICATION NO. | : 10/533565 | |
| DATED | : March 25, 2008 | |
| INVENTOR(S) | : Tohru Den et al. | |

It is certified that error appears in the above-identified patent and that said Letters Patent is hereby corrected as shown below:

ON THE TITLE PAGE ITEM [54]:

Title, "NANOSTRUCTURE, ELECTRONIC DEVICE AND METHOD OF MANUFACTURING THE SAME" should read --NANOSTRUCTURE CONTAINING COLUMNAR MEMBERS SURROUNDED BY A REGION, ELECTRONIC DEVICE AND METHOD OF MANUFACTURING THE SAME.--.

COLUMN 1:

Line 1, "NANOSTRUCTURE," should read --NANOSTRUCTURE CONTAINING COLUMNAR MEMBERS SURROUNDED BY A REGION,--;
Line 7, "relates" should read --relates to--; and
Line 49, "reach other," should read --each other.--.

COLUMN 2:

Line 51, "growth stating" should read --growth starting--; and
Line 60, "is which" should read --in which--.

COLUMN 3:

Line 15, "conceivable. For" should read --conceivable, for--.

UNITED STATES PATENT AND TRADEMARK OFFICE
CERTIFICATE OF CORRECTION

PATENT NO. : 7,348,670, B2
APPLICATION NO. : 10/533565
DATED : March 25, 2008
INVENTOR(S) : Tohru Den et al.

It is certified that error appears in the above-identified patent and that said Letters Patent is hereby corrected as shown below:

<u>COLUMN 7</u>:

Line 8, "row material" should read --raw material--; and
Line 13, "amount a" should read --amount of a--.

Signed and Sealed this

Second Day of September, 2008

JON W. DUDAS
*Director of the United States Patent and Trademark Office*